US007123970B1

(12) United States Patent
Stroomer

(10) Patent No.: US 7,123,970 B1
(45) Date of Patent: Oct. 17, 2006

(54) METHOD AND SYSTEM FOR ANNOTATING A COMPUTER PROGRAM OR HARDWARE DESIGN

(75) Inventor: Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 488 days.

(21) Appl. No.: 09/993,258

(22) Filed: Nov. 13, 2001

(51) Int. Cl.
*G06F 19/00* (2006.01)
*G06F 9/00* (2006.01)
(52) U.S. Cl. .............................. 700/17; 707/4; 717/105
(58) Field of Classification Search ................. 700/17, 700/83, 90; 717/127–130, 136, 178, 105, 717/106, 110, 113, 109, 170; 707/102, 200, 707/4; 395/144–148, 157
See application file for complete search history.

(56) References Cited

U.S. PATENT DOCUMENTS 5,513,305 A * 4/1996 Maghbouleh ............... 715/500
6,622,299 B1 * 9/2003 Santosuosso et al. ....... 717/127
6,701,513 B1 * 3/2004 Bailey ......................... 717/109
6,725,453 B1 * 4/2004 Lucas et al. ................. 717/178
6,735,759 B1 * 5/2004 Yamamoto et al. .......... 717/136
6,748,583 B1 * 6/2004 Aizenbud-Reshef et al. ............................ 717/127
6,951,010 B1 * 9/2005 Sasaki ......................... 717/123
6,993,759 B1 * 1/2006 Aptus et al. ................. 717/170

\* cited by examiner

*Primary Examiner*—Kidest Bahta
(74) *Attorney, Agent, or Firm*—Pablo Meles; LeRoy D. Maunu

(57) ABSTRACT

The invention provides a method for annotating a computer program. Program code for the computer program can be displayed in a user interface (100) having a code display window (105). One or more elements of the displayed program code can be linked to a data file (120) having one or more implementation instructions for elements of the computer program. In response to a query initiated by selecting one of the linked elements (157), a corresponding implementation instruction for the queried element can be displayed in an implementation display window (115) of the user interface.

36 Claims, 3 Drawing Sheets

METHOD AND SYSTEM FOR ANNOTATING A COMPUTER PROGRAM OR HARDWARE DESIGN

FIELD OF THE INVENTION

This invention relates generally to a method and system for creating a computer program or hardware design, and more particularly to a method and system for annotating a computer program or hardware design with instructions specifying details of implementation.

BACKGROUND OF THE INVENTION

The development of most computer programs requires writing code in a high level language, checking the code to ensure it faithfully reflects the underlying algorithm, and translating the code into equivalent machine instructions. The machine instructions direct a computer to perform the computation specified by the original program. Numerous tools aid the development of programs. For example, editors simplify searching and manipulating code specified in high-level languages. Compilers check the syntax of code written in high level languages and translate code into machine-executable form. Integrated development environments (IDEs) facilitate the efficient production of code. An IDE provides a single user interface having many of the tools that are required throughout the software development cycle. Most IDEs have an editor, a compiler, and a debugger integrated into a single user interface. Each of these development tools can be controlled from within the IDE.

While the aforementioned development tools simplify writing, compiling, and debugging code, they largely ignore an aspect of software development that programmers would like to control: specifying in detail and in a convenient way how software should be implemented at the machine level.

Some tools support global control of implementation such as "optimize code for speed" or "suppress bounds checking on arrays", but do not allow a finer level of control. For example, when only global instructions are available, it is not possible for a programmer to identify a particular loop that should be optimized, or a particular array for which bounds checking should be suppressed. A few tools allow detailed control of implementation, but do so by requiring that the programmer embed "implementation comments" in the program near the construct whose implementation is to be tailored. Such comments obscure the meaning of the program, making it difficult to understand and modify. This is a particular concern when (as is typically the case) the program is large or complex, is to be modified by a number of programmers, and must be maintained and enhanced over a number of years. To avoid this problem, a tool might allow the comments to be stored in a "side file" instead of being embedded directly in the program. Unfortunately, this burdens the programmer with the job of identifying the program construct to which each implementation comment applies. Moreover, each change to the program potentially requires a corresponding manual change to the side file so the two stay synchronized. Whether implementation comments are embedded directly in a program or isolated in a side file, there is another problem: the programmer has a difficult time knowing what sorts of implementation comments are allowed, and what syntax they must be expressed in.

Given these and other inherent drawbacks, there is a need for a more efficient method and system for annotating computer program code with instructions describing details of implementation.

While the above discussion is framed in terms of computer programs, the same problems arise when electronic designs are specified using hardware definition languages (HDLs). Here too the designer would like a fine degree of control over the implementation, and until now has had only global and awkward mechanisms for controlling implementation.

SUMMARY OF THE INVENTION

The invention can preferably be a system for annotating portions of a computer program or HDL hardware design with implementation instructions. For simplicity we describe the invention in terms of computer programs. The system can comprise of a traditional program development environment (e.g., a text editor or an IDE), but augmented with facilities for creating implementation instructions, and associating the instructions to the program constructs they describe. To specify implementation instructions, a user of the system can open a window that displays the program, and then uses a pointing device (such as a mouse) to select a program construct to which implementation instructions should be associated. The system may respond by displaying a second window in which instructions for that construct can be specified. The instruction window is only loosely coupled with the program window; it can be repositioned, resized, closed or minimized. The form of the instruction window is preferably tailored to the program object to which instructions are being attached. For example, when the object is the declaration of a scalar variable, the instruction window might present a checkbox selecting whether the variable should be stored in a register. If, instead, the object is a for-loop, the window might have checkboxes selecting whether the loop variable should be stored in a register, and whether the loop should be unscrolled. Preferably, the implementation instructions window is automatically tailored so the choices offered to the user are automatically limited to those that are feasible. For example, when loop bounds are dynamic, the loop unscrolling checkbox in the loop's implementation instructions window might be grayed out, indicating unscrolling is not possible for this loop.

Preferably, the system automatically maintains the links between program constructs and the corresponding implementation instructions. If, for example, the user deletes a portion of a program, the system can automatically and silently update links so the instructions for the deleted portion are discarded, and the correspondence between the remaining portions of the program and their instructions is maintained. The system may also track changes to the program so that corresponding changes to implementation instructions can be made silently and automatically. For example, suppose a loop having static bounds has an associated "unscroll loop" implementation instruction. When the user switches the loop at to use dynamic bounds, the system could automatically remove the loop unscrolling instruction.

DETAILED DESCRIPTION OF THE DRAWINGS

It should be appreciated that while, for simplicity, the invention is described in terms of implementation instructions for program code, the invention is equally applicable to electronic designs described in hardware description languages.

Figure 1:
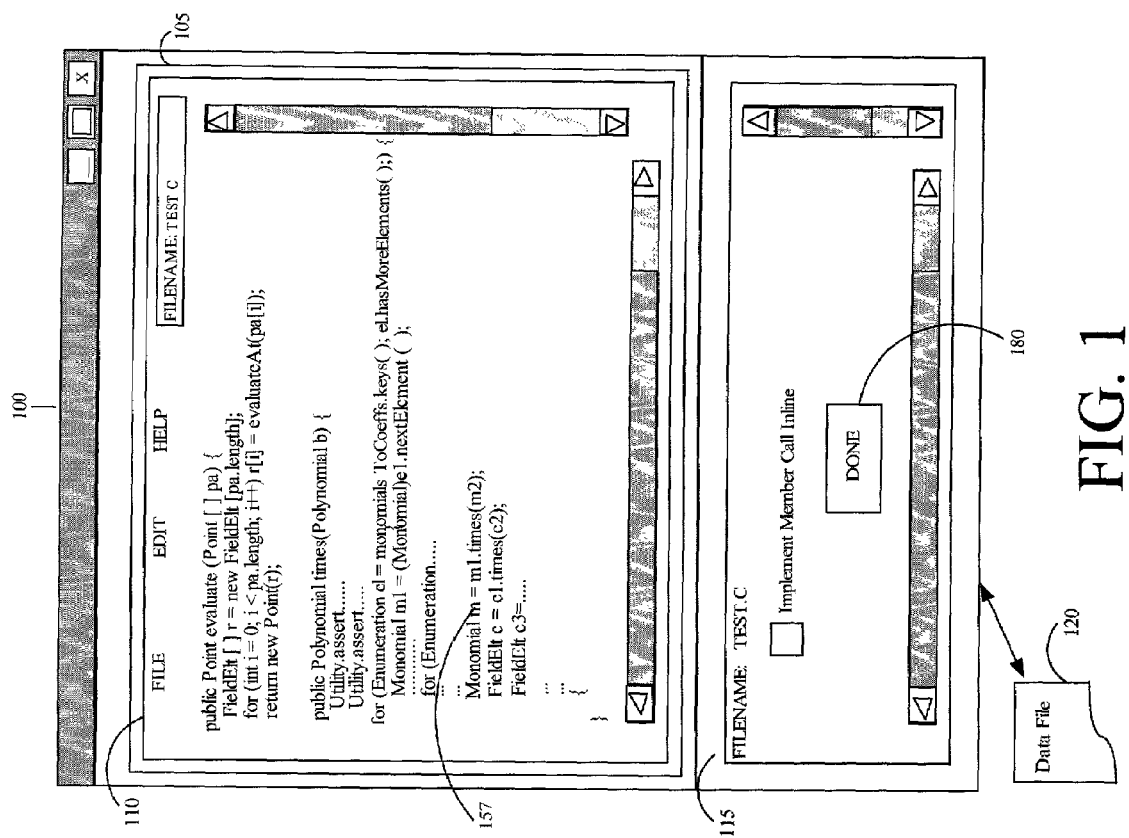
FIG. 1 is a block diagram of a code development system in accordance with the invention.

Referring to FIG. 1, there is shown a block diagram of a code development system in accordance with the invention. There is shown in FIG. 1, a user interface 100, having a code display window 105, an editor 110, a code implementation window 115 and a data file 120. User interface 100 can be a graphical user interface (GUI), which is configurable. For example, the size of GUI 100 can be altered by dragging at the corners of GUI 100. The location of the code display window 105 and implementation display window 115 within the GUI 100 can also be altered (resizing or relocating) by dragging the windows 105 and 110.

The code display window 105 can be utilized for displaying the contents of a file containing computer program code. For example, program code written in a high level language can be displayed in code display window 105. The code display window 105 can be configured so that an editor 110 can be displayed within code display window 105. Typically, the editor 110 is a text editor having searching and editing functions to facilitate writing and editing the computer program code. The implementation display window 115 can be utilized for displaying computer program code implementation details, which can be stored in a data file 120.

In operation, program editor 110 can be initiated within the code display window 105. The file containing the computer program code can be opened in the editor 110 for display in the code display window 105. The editor 110 can be configured so that it is aware of the form of the computer program code being opened. For example, if the computer program code was written in the "Java" high level programming language, then the editor 110 can be configured to identify program code elements, such as variables, expressions, function calls, program code comments, register declarations, user defined declarations and other similar program code elements.

The editor 110 can be made aware of the implementation instructions associated to the computer code being loaded by reading implementation instructions from the data file 120. Alternatively, some implementation instructions for some program code can be identified by parsing the file containing the program code that is to be loaded in the editor 110. These can include, but are not limited to, program code comments, function declarations, variable declarations, and expressions. In any event, data file 120 can be automatically generated while the program code is being written in the high level language. Alternatively, data file 120 can be generated by a separate utility after the program code has been written. As a further alternative, implementation instructions can be added to the data file 120 by using editor 110 and an existing or a new implementation instruction display window.

Once the editor is aware of the implementation instructions, the code display window 105 can be accordingly configured to discriminately display the various program code elements that have corresponding implementation instructions. In one aspect of the invention, different colors or shades of gray can be used to discriminate between the various computer program code elements that have corresponding implementation instructions. As a result, the computer program code elements can be displayed in the code display window 105 using different colors or shades. This can be advantageous since the program code elements having associated implementation instructions can easily be identified and distinguished in the code display window 105. In making the editor aware of the implementation instructions, an association or link can be created between a program code element and its corresponding implementation instruction. It should be readily understood by those skilled in the art that using colors or shades to identify program code elements is not intended to be a limitation on the invention and other arrangements are possible. For example, absent colors or shades, merely placing a pointing device over portions of the computer program code displayed in the code display window 105 can result in the implementation instructions being displayed in the implementation display window 115.

Referring again to FIG. 1, the program code element 157 which is displayed in the program code display window 105 is the assignment statement "Monomial m=m1.times(m2)." The program code element 157 can be highlighted in the editor 110 displayed in the program code display window 105. In one aspect of the invention, since the program code element 157 is highlighted, it has a corresponding implementation description in the data file 120. Notably, when program code element 157 is selected, the corresponding implementation instruction linked to the selected program code element 157, can be acquired from the data file 120 and displayed in the implementation display window 115. The implementation instruction for the program code element 157 is "Implement Member Call Inline." If the check box next to the implementation instruction is checked, then the code that implements the call on "times" in program code element 157 will be in-lined.

Figure 2:
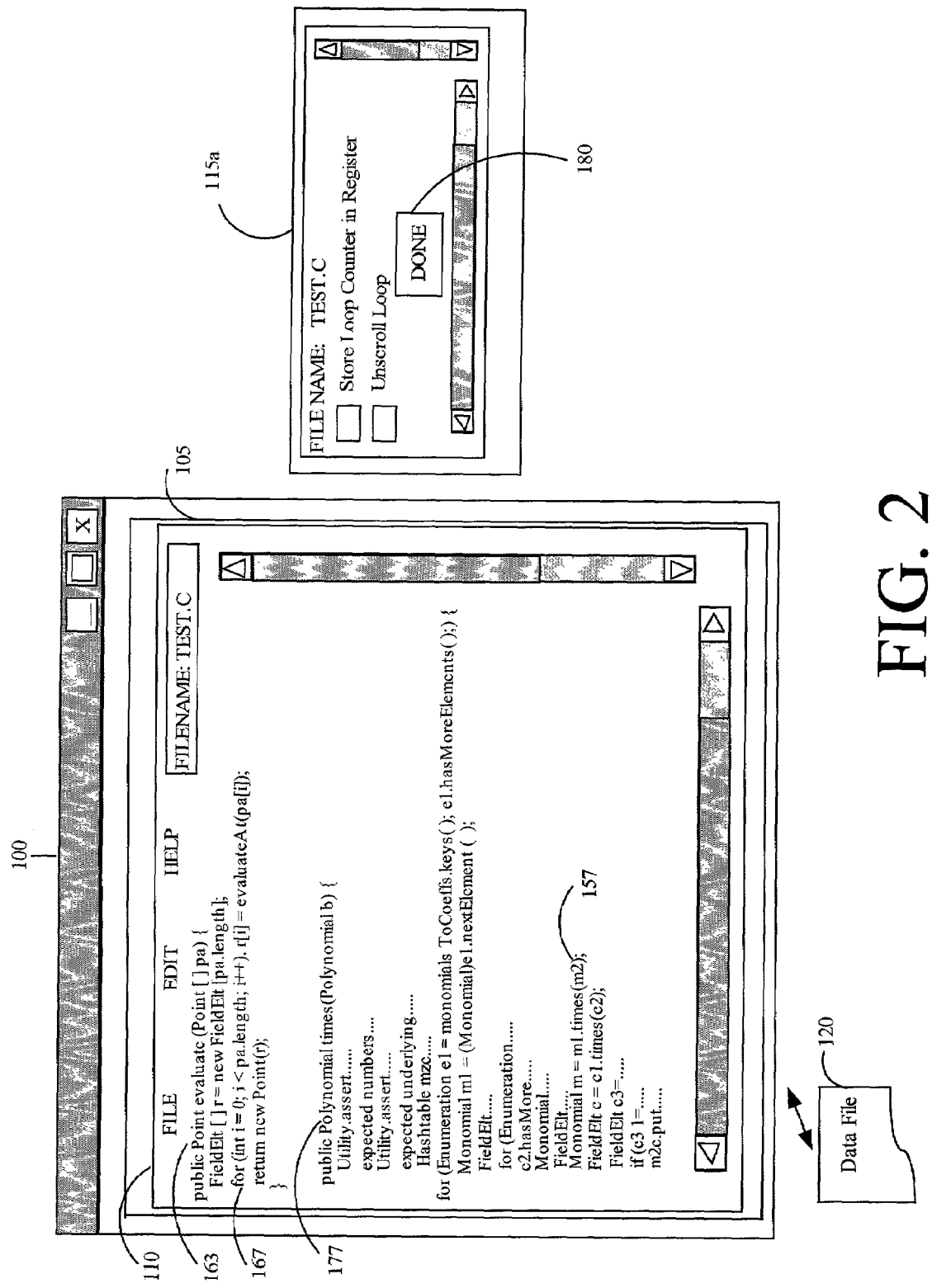
FIG. 2 is an alternate code development system of FIG. 1 in accordance with the present invention.

Turning now to FIG. 2, an alternative arrangement of the invention is illustrated therein. Referring to FIG. 2, there is shown user interface 100, wherein the implementation display window 115 (FIG. 1) has been configured as a pop-up implementation display window 115a. In operation, the pop-up implementation display window 115a can be activated by selecting a program code element, such as a function, variable, expression, object or similar entity of the computer program code displayed in code display window 105. The selection of the program code element can be achieved by using a pointing device, such as a mouse, to click or highlight the implementation instruction. Additionally, moving the pointing device slowly or resting a pointer for the pointing device over an implementation instruction can display the pop-up implementation instruction display window 115a. The pop-up implementation instruction display window 115a can be closed by selecting the "done" icon 180.

Still referring to FIG. 2, there is shown a function 163 called "Evaluate." Function 163 contains a loop expression 167 which is a program code element having corresponding implementation instructions which can be stored in data file 120. By selecting the loop expression 167, the implementation display window 115a can be displayed as a pop-up window. The location of the implementation display window 115a be can be configured so that it provides an unobscured view of the code display window 105, or it partially obscures the code display window 105. In the unobscured view, the implementation display window can be located outside the code display window 105. The implementation display 115a contains a first instruction that allows the loop counter (i) to be stored in a register to speed up execution. A second instruction can be used to un-scroll the loop. To enable or disable an implementation instruction displayed in the implementation display window 115a, the check box next to an implementation instruction can be checked or unchecked respectively.

It should be recognized that although only a single implementation display window is displayed in the aforementioned figures, multiple implementation display windows can be displayed without departing from the spirit of the invention. Each implementation display can remain open until closed. Furthermore, although the "Java" programming is used throughout the illustrative embodiments, the invention is not limited in this respect. Consequently, the invention is equally applicable to other programming languages.

Figure 3:
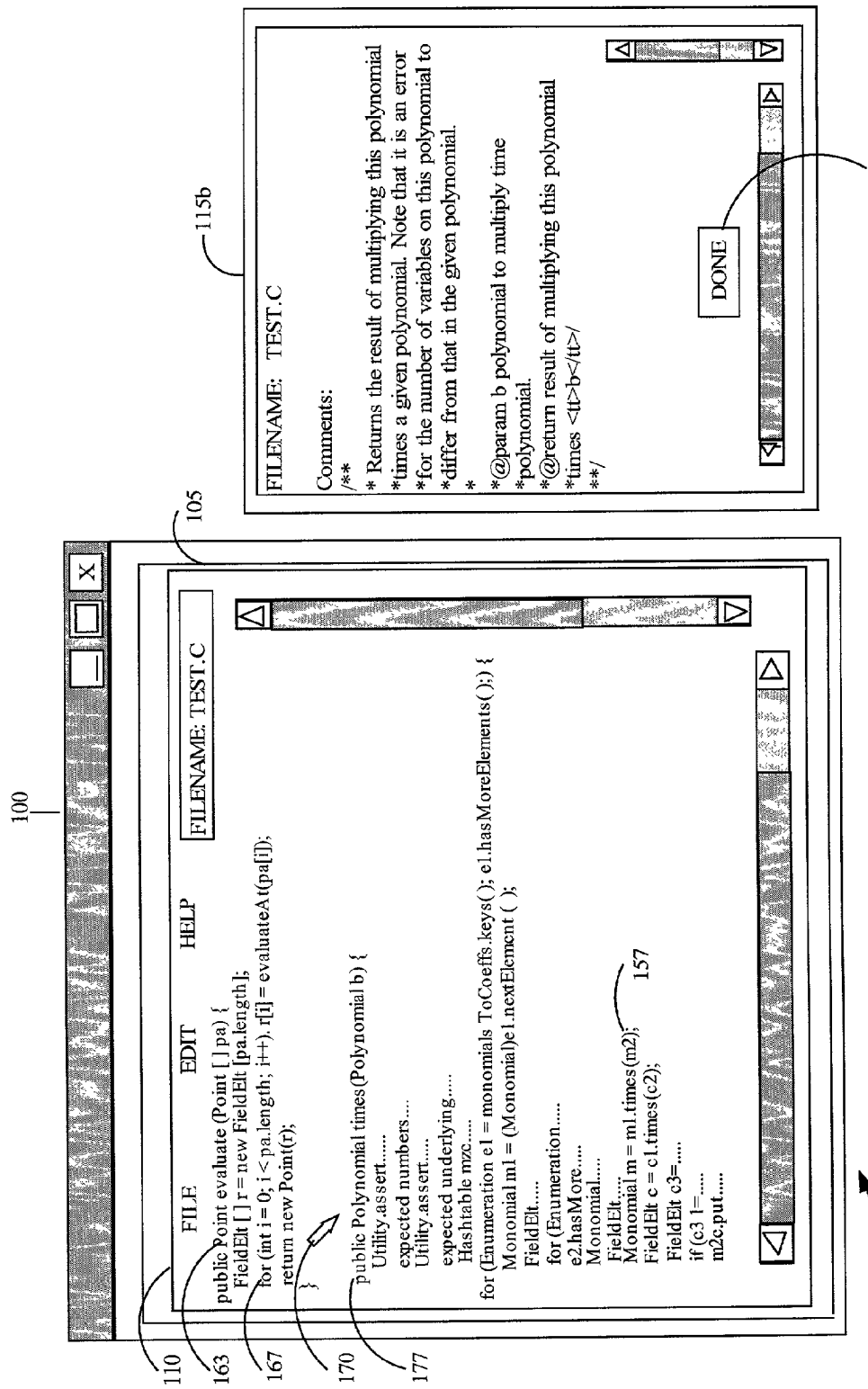
FIG. 3 is an alternate code development system of FIG. 1 in accordance with the present invention.

In a further aspect of the invention, FIG. 3 depicts a pointer 170 placed above function 177 called "Polynomial times." Although the location above the function 170 has not been highlighted, nor does it have any indicator to indicate the presence of a linked implementation instruction, that location nevertheless has a corresponding implementation instruction, which is a comment. By moving the pointer over the region immediately above the function 177, the comment can be displayed in the implementation display window 115b. The implementation display window 115b can be configured to pop-up and not obscure the program code displayed in the code display window 105. To close the implementation instruction window 115b after the comment has been read, the "done" icon 180 can be selected.

In light of the foregoing description of the invention, it should be recognized that the present invention can be realized in hardware, software, or a combination of hardware and software. A method and system for annotating a computer program according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims. As previously stated, it is certainly within contemplation of the present invention that the scope of the recited claims be equally applicable to electronic designs described in hardware description languages.

What is claimed is:

1. A method for annotating a computer program, the method comprising:
    displaying program code for the computer program in a user interface comprising a code display window;
    linking a plurality of elements of said displayed program code to a data file, said data file comprising implementation instructions for said plurality of elemens of the computer program; including instructions that include program code comments; directing for a variable in the program code in a register, and calling a function as in-line code, wherein at least one of the elements of the program code is linked to comments, and at least one of the elements of the program code is linked to the first directive, and at least one of the elements is linked to the second directive; and
    displaying a corresponding implementation instruction for said queried element in said user interface and in response to a query of one of said at least one linked element of the computer program.

2. The method according to claim 1, wherein said step of displaying program code in said code display window further comprises displaying said program code in a text editor viewable within said code display window.

3. The method according to claim 2, further comprising responsive to said query of one of said at least one linked element, inputting an implementation instruction for said queried element in said implementation display window.

4. The method according to claim 3, further comprising storing said inputted implementation instruction in said data file.

5. The method according to claim 1, wherein said step of displaying said corresponding implementation instruction further comprises displaying said corresponding implementation instruction in an implementation display window of said user interface.

6. The method according to claim 3, wherein said step of displaying said corresponding implementation instruction further comprises the step of displaying said implementation instruction in said implementation display window of said user interface without obscuring the program code.

7. The method according to claim 1, further comprising the step of initiating said query of one of said at least one linked element by selecting said linked element displayed in said code display window.

8. The method according to claim 1, wherein said at least one element is selected from the group consisting of functions, variables, and expressions.

9. The method of claim 1, wherein the implementation instructions further include a third directive that directs an un-scrolled implementation of a loop in the program code, and at least one of the elements of program code is linked to the third directive.

10. A computer code development system for annotating computer program code, the system comprising:
    a user interface having a code display window for displaying computer program code;
    an editor for editing displayed computer program code in said code display window; and
    a data file comprising a plurality of implementation instructions linked to a plurality of elements of the computer program code; including instructions that include program code comments; directing for a variable in the program code in a register, and calling a function as in-line code, wherein at least one of the elements of the program code is linked to comments, and at least one of the elements of the program code is linked to the first directive, and at least one of the elements is linked to the second directive; wherein the user interface is adapted to display in said user interface, responsive to a query of one of said at least one linked element of the computer program, a corresponding implementation instruction for said queried element.

11. The computer code development system according to claim 10, wherein said user interface further comprises an implementation display window for displaying said at least one implementation instruction.

12. The computer code development system according to claim 10, further comprising a linker, said linker for linking said at least one program code element to said at least one implementation instruction in said data file.

13. The computer code development system according to claim 10, wherein said at least one element of the computer program code is selected from the group consisting of functions, variables, grouped functions, grouped variables, expressions, implementation instructions and any combination thereof.

14. The computer code development system according to claim 10, wherein said implementation development window is a pop-up window accessible by selecting at least one of said at least one element of the computer program code from said code display window.

15. The computer code development system according to claim 14, wherein said implementation development window and said code display window are concurrently viewable.

16. The computer code development system according to claim 10, wherein said implementation development window does not obscure said code display window when concurrently viewed.

17. The system of claim 10, wherein the implementation instructions further include a third directive that directs an un-scrolled implementation of a loop in the program code, and at least one of the elements of program code is linked to the third directive.

18. A user interface for annotating computer program code, the user interface comprising:
   a code display window for displaying the computer program code, said code display window having an editor for editing the computer program code;
   an associated a data file comprising a plurality of implementation instructions linked to a plurality of elements of the computer program code; including instructions that include program code comments; directing for a variable in the program code in a register, and calling a function as in-line code, wherein at least one of the elements of the program code is linked to comments, and at least one of the elements of the program code is linked to the first directive, and at least one of the elements is linked to the second directive; and
   an implementation instruction window for displaying an implementation instruction in said data file responsive to a query of one of the plurality of linked elements of the computer program.

19. The user interface according to claim 18, further comprising a linker for linking said at least one program code element to said at least one implementation instruction in said data file.

20. The user interface according to claim 19, wherein said implementation development window and said code display window are concurrently viewable.

21. The user interface according to claim 20, wherein said implementation development window can be configured so that said code display window and said implementation development window can be completely viewed when concurrently displayed.

22. The user interface according to claim 20, wherein said implementation development window can be configured so that said code display window is partially obscured by said implementation development window when concurrently displayed.

23. The user interface of claim 18, wherein the implementation instructions further include a third directive that directs an un-scrolled implementation of a loop in the program code, and at least one of the elements of program code is linked to the third directive.

24. A machine readable storage having stored thereon, a computer program having a plurality of code sections, said code sections executable by a machine for causing the machine to perform the steps of:
   displaying program code for the computer program in a user interface comprising a code display window for annotating a computer program;
   linking a plurality of elements of said displayed program code to a data file, said data file comprising implementation instructions for said plurality of elements of the computer program, including instructions that include program code comments; directing for a variable in the program code in a register, and calling a function as in-line code, wherein at least one of the elements of the program code is linked to comments, and at least one of the elements of the program code is linked to the first directive, and at least one of the elements is linked to the second directive; and
   displaying a corresponding implementation instruction for said queried element in said user interface and in response to a query of one of said at least one linked element of the computer program.

25. The machine readable storage according to claim 24, wherein said step of displaying program code in said code display window further comprises displaying said program code in a text editor viewable within said code display window.

26. The machine readable storage according to claim 25, further comprising responsive to said query of one of said at least one linked element, inputting an implementation instruction for said queried element in said implementation display window.

27. The machine readable storage according to claim 26, further comprising storing said inputted implementation instruction in said data file.

28. The machine readable storage according to claim 24, wherein said step of displaying said corresponding implementation instruction further comprises displaying said corresponding implementation instruction in an implementation display window of said user interface.

29. The machine readable storage according to claim 26, wherein said step of displaying said corresponding implementation instruction further comprises the step of displaying said implementation instruction in said implementation display window of said user interface without obscuring the program code.

30. The machine readable storage according to claim 24, further comprising the step of initiating said query of one of said at least one linked element by selecting said linked element displayed in said code display window.

31. The machine readable storage according to claim 24, wherein said at least one element is selected from the group consisting of functions, variables and expressions.

32. The machine readable storage of claim 24, wherein the implementation instructions further include a third directive that directs an un-scrolled implementation of a loop in the program code, and at least one of the elements of program code is linked to the third directive.

33. A method for development of computer program code, comprising:
   displaying a portion of computer program code in a first portion of a display;

storing a plurality of implementation instructions in association with a plurality of elements of the computer program code in response to user selections of the plurality of elements in the computer program code and a user input of the plurality of including instructions that include program code comments; directing for a variable in the program code in a register, and calling a function as in-line code, wherein at least one of the elements of the program code is linked to comments, and at least one of the elements of the program code is linked to the first directive, and at least one of the elements is linked to the second directive;

displaying in a second portion of the display that is separate from the first portion of the display an implementation instruction associated with a first element in the computer program code in response to a user selection of the first element.

34. The method of claim 33, further comprising updating the portion of program code in the first portion of the display in response to a user input.

35. The method of claim 33, further comprising reading a stored implementation instruction linked to an element in the computer program code in response to a user selection of the element from the first portion of the display.

36. The method of claim 33, wherein the plurality of elements include functions, variables, and expressions.

* * * * *